United States Patent
Squires (10) Patent No.: US 7,310,794 B1
(45) Date of Patent: Dec. 18, 2007

(54) BACKWARD COMPATIBLE PLDS

(75) Inventor: David B. Squires, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 2 days.

(21) Appl. No.: 11/111,338

(22) Filed: Apr. 21, 2005

(51) Int. Cl.
*G06F 17/50* (2006.01)
*H03K 17/693* (2006.01)

(52) U.S. Cl. .................................................... 716/16

(58) Field of Classification Search ................... 716/16
See application file for complete search history.

(56) References Cited

U.S. PATENT DOCUMENTS

| | | | |
|---|---|---|---|
| 5,815,405 A * | 9/1998 | Baxter ............................ 716/3 |
| 7,038,490 B1 * | 5/2006 | Singh et al. .................. 326/41 |
| 2003/0200520 A1 * | 10/2003 | Huggins et al. .............. 716/16 |
| 2004/0021490 A1 * | 2/2004 | Baxter et al. ................ 327/165 |
| 2004/0139411 A1 * | 7/2004 | Smith et al. ..................... 716/7 |
| 2005/0138595 A1 * | 6/2005 | Khakzadi et al. ............. 716/18 |
| 2005/0235239 A1 * | 10/2005 | Matsubara .................... 716/10 |

* cited by examiner

*Primary Examiner*—Jack Chiang
*Assistant Examiner*—Suresh Memula
(74) *Attorney, Agent, or Firm*—Scott R. Brown; Kevin T. Cuenot (57) ABSTRACT

A computer-readable medium is encoded with a computer program for directing a computer to convert a first bitstream operable to configure, for example, an earlier-generation PLD to a second bitstream operable to configure, for example, a later-generation PLD, wherein functionality is preserved from one PLD to another. The computer divides each PLD into similar regions, and replicates a function of each region of the first PLD in a corresponding region of the second PLD. The computer interconnects the regions of the second PLD to replicate the interconnections of the regions of the first PLD. The computer allows a user to manipulate the connection scheme of the second PLD.

10 Claims, 6 Drawing Sheets

BACKWARD COMPATIBLE PLDS

FIELD OF THE INVENTION

The present invention relates to Programmable logic devices (PLDs). More particularly, embodiments of the present invention relate to a method and computer program for converting a first bitstream operable to configure a first PLD, such as an earlier-generation PLD to a second bitstream operable to configure a second PLD, such as a later-generation PLD, wherein functionality is preserved from one PLD to another.

BACKGROUND

Programmable logic devices (PLDs), such as field programmable gate arrays (FPGAs) and complex programmable logic devices (CPLDs) are commonly used to develop and implement complex digital designs. Such devices include a variety of configurable digital logic elements, including combinatorial and sequential logic elements. Combinatorial logic elements include, for example, programmable look-up tables and logic gates such as "AND" gates and "OR" gates, while sequential logic elements include memory elements such as "flip-flops" and "latches."

Many programmable logic devices now include configurable logic blocks (CLBs) and pre-designed, hardwired logical structures or "cores." CLBs are groups of logic elements that form the basic programmable element of the device. Each CLB typically includes a collection of combinatorial and sequential elements placed on the device and interconnected according to a pre-determined and uniform pattern. Pre-designed cores, also referred to as "firm-IP" cores or just "firm" cores, facilitate the development process by giving the programmable device pre-determined functionality. Examples of firm cores include digital processors and network interconnections.

Programmable logic devices are favored by many developers because they are easily configured and reconfigured, facilitating the development cycle of testing a design, making changes accordingly, and retesting. Design typically begins with "high level" development, wherein an engineer creates the design using a hardware description language, such as VHDL or Verilog, or a circuit schematic design entry tool. Design testing usually begins at the high level to ensure proper functionality.

Software is then used to "place" the high level design onto a digital device by implementing the various functions of the design in various CLBs or other logic elements or groups of elements. The design may again be tested after the design has been placed on the device. At that point, the functionality of the design and the behavior of the device are simulated and tested to ensure, for example, that timing constraints are met. Often at this stage engineers need to correct timing issues by changing the manner in which the design was placed on the device. This often involves the use of special software to reconfigure or reconnect CLBs.

Once simulated testing has been completed, a device is configured according to the design. Such devices are typically configured by a configuration bitstream generated by the design software, wherein each bit or subcombination of bits in the bitstream indicates, for example, which CLBs are used and how the CLBs are configured and interconnected. The configuration bitstream is communicated to the device via an input port of the device and is stored, for example, in static memory cells wherein the values in the cells control all programmable elements on the device, including routing resources.

Developments in technology have increased the functionality of programmable logic devices. Advancing technology, for example, enables manufacturers to create devices with smaller, faster and more densely placed logic elements. Such devices are more robust than their predecessors. As demand for a new generation of programmable devices increases, demand for the previous-generation of devices declines accordingly and manufacturers eventually discontinue production of the older devices.

In addition, as the new generation of devices become available, it would reduce costs if the old design could be used in the new device. Unfortunately, replacing the previous device is not as simple as placing the new device in the product and configuring it with the previous configuration bitstream.

Re-implementing a design in a new programmable logic device can consume a great deal of time and money, particularly if the design is complex. Because the new device is built differently and includes new functionality, the configuration bitstream used in the previous device cannot be used "as is" to configure the new device. A common way of migrating an existing design to a new device is to begin with the high level design (VHDL, Verilog, schematic, etc.) and compile the design specifically for the new device. This is a time-consuming process because the design has to be resimulated and retested to ensure timing constraints are met. Furthermore, if the design does not conform to the timing or other requirements of the design, engineers have to spend additional time adjusting the layout of the design on the new device, or possibly even redesign a portion of the design, to make the new device compatible with the product.

These challenges can be further complicated if a user desires to replace the original device with a new device made by a different manufacturer. The user may discover, for example, that a device developed by another manufacturer would be the best fit or most cost effective replacement. Fundamental differences in architecture between the original device and the new device may require extensive redesign far in excess of what would be required if the design were implemented in a successive-generation device.

One method of avoiding the time-consuming migration process described above involves designing successive generations of programmable devices to be operable to interpret configuration bitstreams from previous generation devices. While this eliminates the need to go through a lengthy redesign process, it suffers from various limitations. Each device, for example, would require extra logic elements operable to determine to which generation an incoming bitstream pertains and to modify the bitstream accordingly to fit the newer device. It will be appreciated that these logic elements would need to be placed on each programmable device, adding to the overall cost of each device. Furthermore, with such a solution it would be difficult or impossible take advantage of new functionality, such as firm cores, in the newer device to improve design performance. Furthermore, such backwards compatible hardware may not be compatible with designs implemented on other families of devices, and almost certainly would not be compatible with designs implemented on devices made by other manufacturers.

Due to the above-mentioned and other problems and disadvantages in the art, a need exists for a method of converting a design implemented on an earlier-generation PLD to a design compatible with a successive generation PLD, wherein the conversion does not require extensive redesign or testing of the new PLD and does not require dedicated logic elements on the new PLD.

SUMMARY

The present invention solves the above-described problems and provides a distinct advance in the art of digital design. More particularly, an embodiment of the present invention provides a computer-implemented method of converting a first bitstream operable to configure an earlier-generation PLD to a second bitstream operable to configure a later-generation PLD, wherein functionality is preserved from one PLD to another.

In one embodiment, the method comprises the steps of reading the first bitstream to determine a function of the first programmable logic device; generating a configuration plan for the second programmable logic device that implements the function; generating a configuration report that presents the configuration plan to a user; allowing the user to manipulate the configuration plan; and generating the second bitstream for configuring the second programmable logic device according to the configuration plan.

In another embodiment, the first bitstream is read to determine which design elements of the first device are used and how the elements are interconnected. The first device is then divided into physical regions. The second device is also divided into physical regions, wherein the regions of the second device correspond to the physical regions of the first device. A configuration plan is then created for the second device by replicating a function of each region of the first device in a corresponding region of the second device and interconnecting the regions of the second device according to an interconnection of the regions of the first device. A configuration report is generated that presents the configuration plan to a user and allows the user to manipulate the configuration plan. Finally, the second bitstream is generated for configuring the second programmable logic device according to the configuration plan.

In another embodiment, the first bitstream is first divided into portions containing information relating to PLD device model information, design element information, and design element interconnect information. Bitstream data relating to each design element and each design element interconnect of a first PLD is stored in a first data structure. A device number indicating a model of a second PLD is then received from a user. Data relating to each design element of the second PLD is then stored in a second data structure.

The first PLD is then divided into physical regions, and indicating in the first data structure to which region each design element pertains. The second PLD is also divided into physical regions that substantially correspond to the physical regions of the first PLD.

Primitive design elements are identified in each region of the second PLD, and each element is matched to a substantially similar design element of the first PLD. The primitive design elements in each region of the second PLD are interconnected to replicate the connections between the primitive design elements of corresponding regions of the first PLD. Then the regions of the second PLD are connected to replicate the interconnection of regions of the first PLD. A configuration report is generated, including a report of any elements of the first PLD that could not be replicated in the second PLD, and timing delays of the second PLD that are significantly longer than corresponding timing delays of the first PLD.

The configuration report is presented to the user along with a graphical representation of the elements, regions, and interconnections of the second PLD. The user is allowed to manipulate the configuration plan via the graphical representation. Finally, the second bitstream is generated for configuring the second PLD according to the configuration plan.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF VARIOUS EMBODIMENTS

Figure 1:
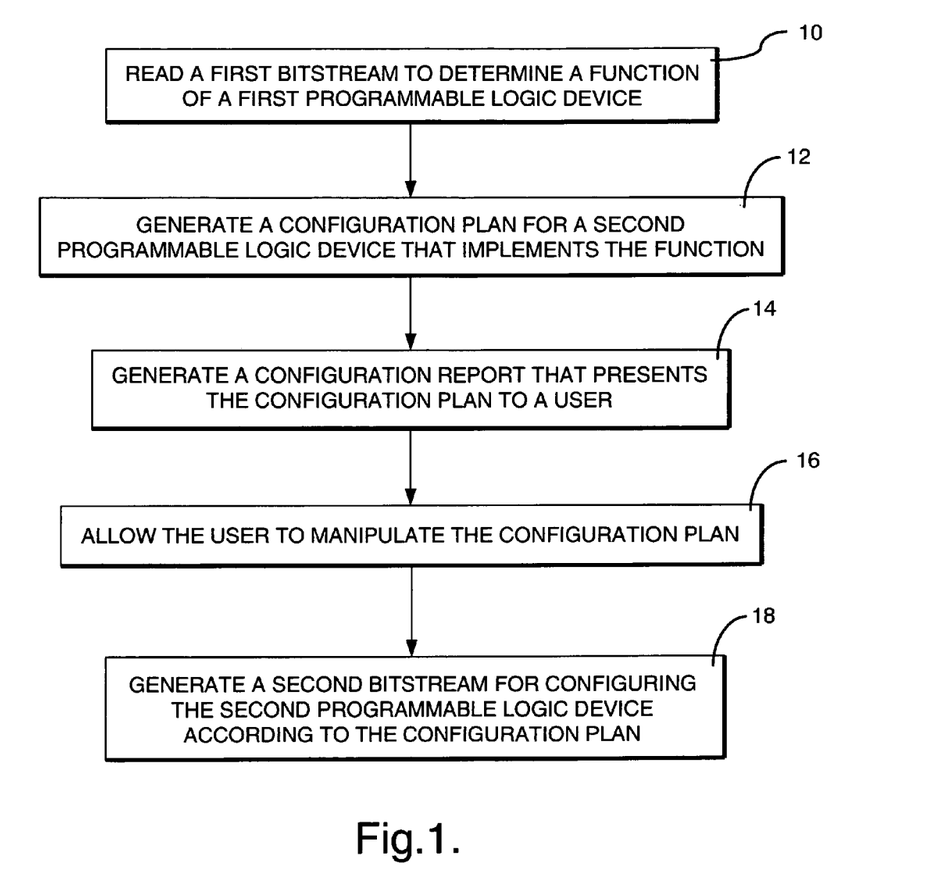
FIG. 1 is a flowchart of steps involved in an exemplary method of converting a first bitstream operable to configure a first programmable logic device to a second bitstream operable to configure a second programmable logic device.

Referring initially to FIG. 1, an exemplary method showing one embodiment of the present invention is shown. The method generally converts a first bitstream operable to configure a first programmable logic device to a second bitstream operable to configure a second programmable logic device. The method is useful, for example, to convert a bitstream operable to configure an earlier-generation FPGA to a bitstream operable to configure a later-generation FPGA, wherein functionality is preserved from one FPGA to another.

The method broadly comprises the steps of reading the first bitstream to determine a function of the first programmable logic device, as depicted in block 10; generating a configuration plan for the second programmable logic device that implements the function, as depicted in block 12; generating a configuration report that presents the configuration plan to a user, as depicted in block 14; allowing the user to manipulate the configuration plan, as depicted in block 16; and generating the second bitstream for configuring the second programmable logic device according to the configuration plan, as depicted in block 18.

In the preferred embodiment, the method is implemented on a computer by a computer-readable medium encoded with a computer program for directing the computer to perform the method. A computer-readable medium is any medium operable to store and/or convey executable instructions to the computer. Such a medium may include, for example, memory elements such as dynamic random access memory (DRAM) and static random access memory (SRAM); physical storage media such as magnetic memory and optical disks; and wireless media such as radio-frequency and optical signals. The computer program may be stored locally on the computer, such as on the computer's hard drive or on a storage disk in communication with the computer, or the program may be communicated to the computer via a network such as a local area network (LAN), an intranet, or the Internet. The computer implementing the program will hereinafter be referred to as "the computer" or the "host computer."

Figure 2:
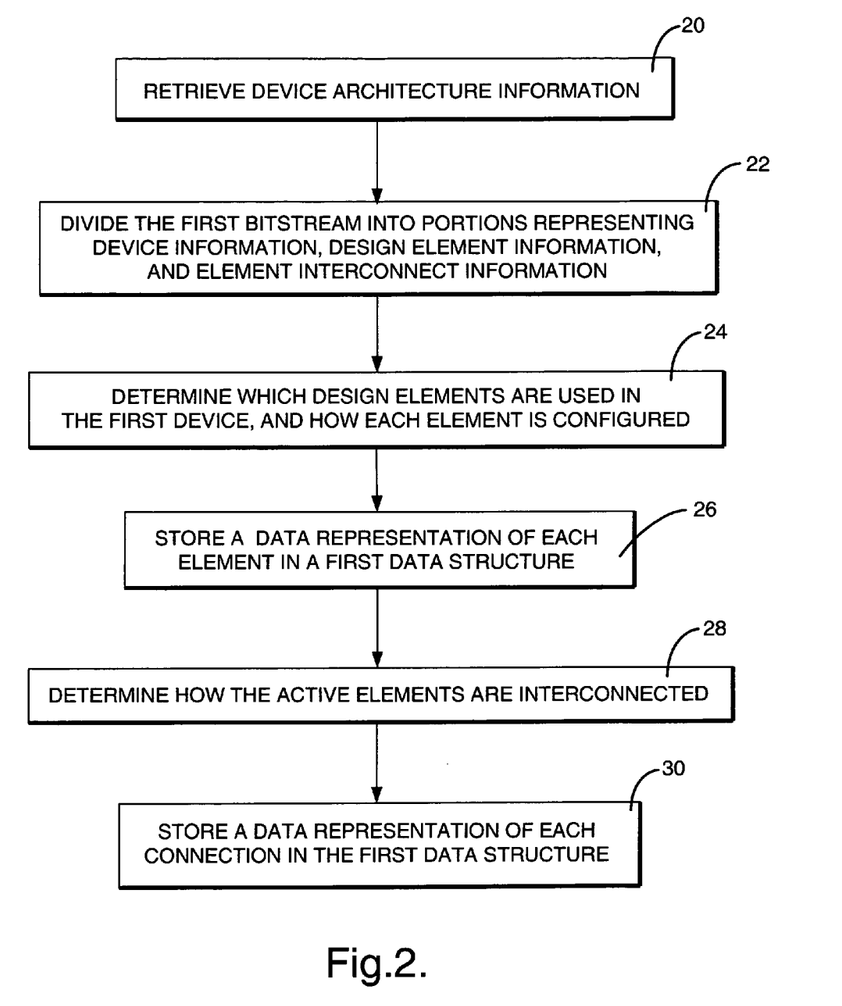
FIG. 2 is a flowchart of steps involved in a method of obtaining configuration information about the first device from the first bitstream.

Referring also to FIG. 2, a method of reading the first bitstream to determine a function of the first programmable logic device is illustrated. The first bitstream is a sequence of bits containing device configuration information that is communicated to the first programmable logic device to program the device. Different portions of the bitstream contain information relating to different aspects of configuration.

First at step 20, device architecture information of the first device is retrieved. This is done by using device model information contained in a first portion of the first bitstream comprising, for example, the first five bytes (forty bits) of data. The device model information contains information relating to the family and model number of the first device. Such information may indicate, for example, that the first device is model number XC4FX140 from the VIRTEX-4™ family of device manufactured by XILINX™. The device model information may further indicate characteristics of the device such as, for example, the number and type of pins, the input and output voltage levels, etc.

The host computer uses the device model information to retrieve the device architecture information corresponding to the first device. This may be done, for example, by submitting a portion of the device model information to a device architecture database and requesting architecture data corresponding to the device model information. At step 22, the device architecture information can then be used with the design element information and the element interconnect information to parse the first bitstream into portions, representing for example, device information, design element information, and element interconnect information The embodiments of the present invention are operable to read bitstreams from various devices, device families, and device manufacturers. Bitstreams corresponding to such different devices, device families, and device manufacturers likely present variations in form and content. Some manufacturers, for example, may choose not to include any device information in the configuration bitstream. The host computer, therefore, is operable to recognize and read bitstreams of various forms. If the first bitstream does not include device information, for example, the host computer may prompt the user to submit that information via a user interface.

Using the design element information from the bitstream and the device architecture information, the computer determines which design elements of the first device are used, as well as how each element is configured, as depicted in block 24. Typically not all design elements of the first device are used in a particular design, therefore the computer determines which elements are used—or are "active"—in the first device.

Data representing each active element of the target device is then stored in a first data structure, as depicted in block 26, wherein the data includes a field indicating a physical location of the element on the target device. Such design elements include, for example, logic elements, look-up tables, flip-flops, latches, input/output blocks, digital clock management blocks, multiplexers, random access memory (RAM) banks, and shift registers. Each active element may be represented by a particular pattern of bits.

Included in the data corresponding to each active element is information indicating a physical location of the element on the target device. This location information is used to preserve timing characteristics when creating a configuration for the second device, as explained below in greater detail. The computer may generate location information in any of a number of ways, such as via a coordinate system in which each element is assigned a value corresponding to a point on an "X" axis and a value corresponding to a point on an "Y" axis, wherein the X axis is normal to the Y axis.

Once the design elements are identified and stored in the first data structure, the host computer determines how the active elements are interconnected, as depicted in block 28. The host computer does this by, for example, using the element interconnect information from the first bitstream and the device architecture information. Each element includes at least one input port and one output port, wherein the element receives data or a signal on the input port, manipulates the data/signal, and transfers the manipulated data/signal to the output port to be communicated to another element. Most design elements have a plurality of input ports and a plurality of output ports. Some input ports and some output ports are connected to, for example, a port of another element, to a power or ground, or to another port of the same design element. In this manner all of the design elements are interconnected to form the overall design. The computer stores data representing each connection between active elements of the first device in the first data structure, as depicted in block 30.

The step of reading a first bitstream to determine a function of the first programmable logic device has been described as breaking a design down according to design elements and element interconnections. The invention is not limited to this method and contemplates other methods of determining a function of the first device by, for example, analyzing a behavior of portions of the design involving two or more design elements.

Figure 3:
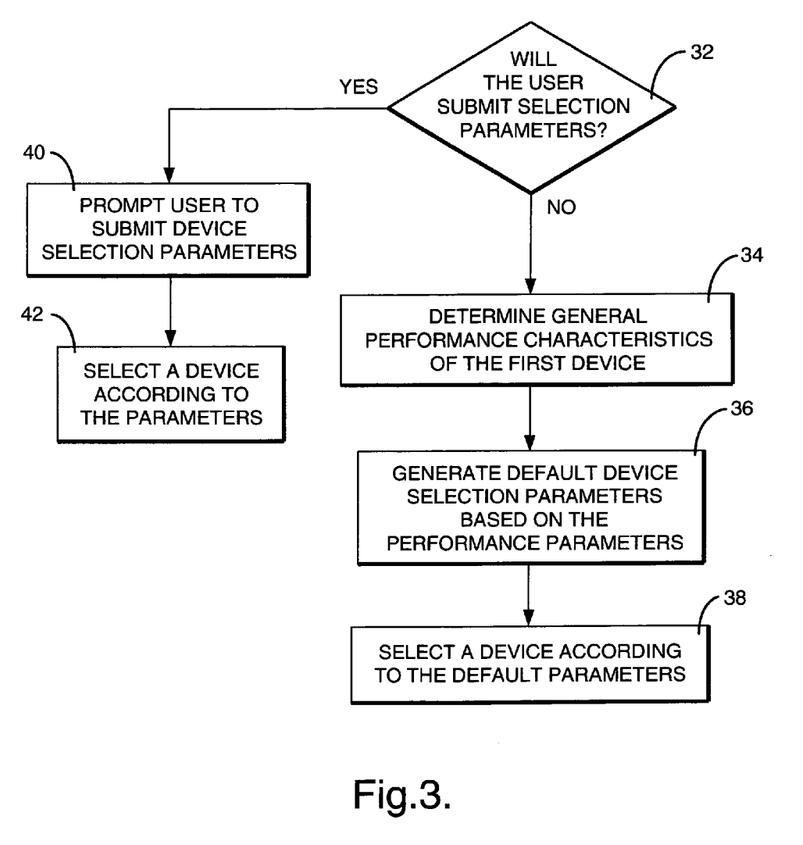
FIG. 3 is a flowchart of steps involved in a method of selecting the second device, wherein the user may select the device or the device may be automatically selected.

After the first bitstream has been read and a function of the first device has been determined, the computer generates a configuration plan for the second programmable logic device that implements the function, as depicted in block 14 of FIG. 1. The first step in generating the configuration plan is selecting the second device. Generally three approaches may be used to select the second device: the user submits a device model, the computer selects the device (automatic selection), or the computer assists the user in selecting the device. The computer first prompts the user to choose one of two options: automatic device selection or user device selection. FIG. 3 illustrates a flowchart of steps of an exemplary method of automatically selecting the second device. When the user chooses automatic device selection, the computer presents the user with the option of submitting device selection parameters, as depicted in block 32.

If the user chooses not to submit selection parameters, the computer automatically chooses the second device. In automatically choosing the second device, the computer first determines general performance characteristics of the first device, as depicted in block 34. Such characteristics may include, for example a broad power consumption estimate and timing characteristics, such as timing delays. It may also include the number of effective logic gates ("gate density") required to implement the target function. The computer then generates default device selection parameters based on the performance characteristics, as depicted in block 36. The default parameters may include, for example, a power consumption limit, logic gate density, and timing constraints approximately equal to the performance characteristics. The default parameters are merely intended to preserve performance from one device to another and therefore need not be stringent.

The computer then selects a device according to the default parameters, as depicted in block 38. In performing this step, the computer may compare the default device selection parameters with similar characteristics of various devices and choose, for example, the least expensive device with performance characteristics within the device selection parameters.

Turning again to block 32, if the user chooses to submit selection parameters, the computer first prompts the user to submit the parameters, as depicted in block 40. Selection parameters may include a variety of constraints the computer uses in selecting the second device from a pool of possible devices. In the preferred embodiment, the user may submit selection parameters relating to speed optimization, power optimization, device utilization optimization, device configuration, and device family or manufacturer. This list is exemplary only, and may include various other selection parameters.

The computer may optimize speed by, for example, selecting a device designed to operate at higher frequencies. The computer may optimize power by selecting a device that operates at lower internal voltages and/or lower input/output voltages. The computer may optimize device utilization by choosing a device that will have fewer idle elements when implementing the design. The computer may select a device based on device configuration by selecting only devices with a particular type or number of pins and/or pins that are compatible with a previous implementation of the device. Finally, the computer may select a device based on device manufacturer and/or device family by selecting a device made by a particular manufacturer and/or from a particular family of devices.

In choosing a selection parameter, the user may choose to submit a value that serves as an outer limit, or may simply choose to have the computer select a device with the highest or lowest value. For example, the user may indicate that the device must be capable of implementing the design at a speed of at least 500 megahertz, or may indicate that the device should be able to implement the design at as high a speed as possible.

It will be appreciated that allowing the user to submit selection parameters makes the conversion process very flexible because the user can choose to accept lower performance standards in one area in order to optimize performance standards in another area. For example, the user may decide that power consumption is not a limiting factor and choose to accept a device that consumes more power in exchange for a device capable of implementing the design at a higher frequency. Alternatively, the user may decide that price per unit is critical and maximize device utilization to keep prices low while sacrificing device speed and/or power consumption. Alternatively, the user may decide that it is critical that a device with an identical number and type of pins be used so that the second device can serve as a "drop in" replacement of the first device. In that case the user may sacrifice both speed and device utilization considerations to ensure the desired similarity.

The user may choose to submit one or more parameters, and the computer may use default values for any parameters not submitted. Once the device selection parameters have been chosen, the computer selects a device according to the parameters, as depicted in block 42. Of course a user may already have an exact target device in mind and simply identify that at step 40, making no further computer selection input.

Figure 4:
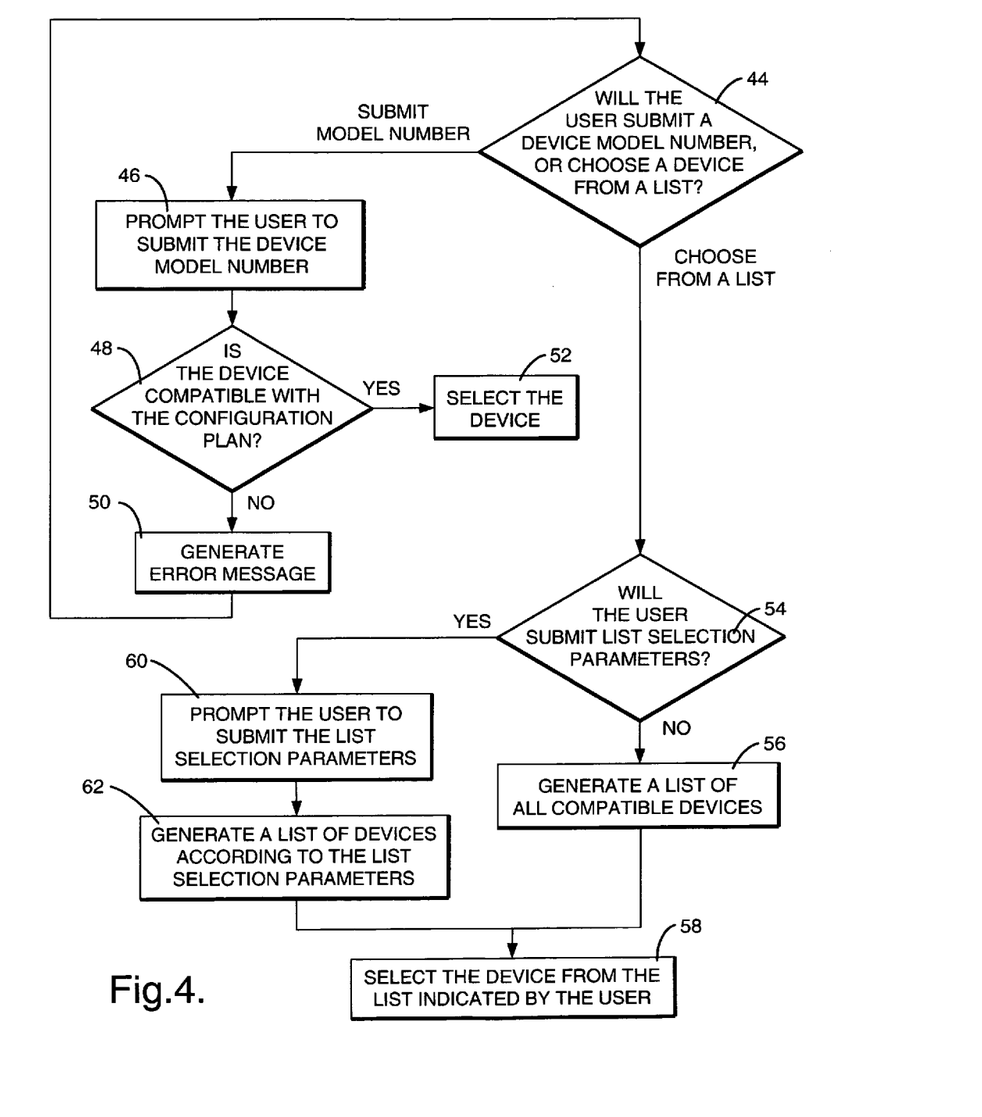
FIG. 4 is a flowchart of steps involved in a method of creating a list of devices from which the user chooses the second device.

FIG. 4 illustrates a flowchart of steps of an exemplary method of user device selection. The host computer first presents the user with the option of submitting a device part number or choosing from a list of device part numbers, as depicted in block 44. If the user opts to submit a device model number, the computer prompts the user to submit the number, as depicted in block 46. The computer then checks the device corresponding to the model number to ensure it is compatible with the configuration plan, as depicted in block 48. The computer may verify compatibility by, for example, comparing the number of elements required by the configuration plan and the number of elements available in the selected device to ensure that the number of available elements in the device does not exceed the number required by the configuration plan by a predetermined amount, such as five percent.

If the computer determines that the device is not compatible with the configuration plan, it generates an error message to present to the user, as depicted in block 50. The error message includes, for example, an explanation of why the device was not compatible, such as insufficient resources. If the computer determines that the device submitted by the user is compatible with the configuration plan, the computer selects that device, as depicted in block 52.

Returning again to block 44, if the user chooses to select the device from a list, the computer prompts the user to indicate whether the user will submit selection parameters to guide the computer in generating the list of compatible devices, as depicted in block 54. If the user chooses not to submit selection parameters, the computer generates a list of all devices that are compatible with the configuration plan, as depicted in block 56.

The list may simply be a scrollable, linear presentation of all devices from all device families, which the user needs to scroll through to find the device he or she would prefer to use. Alternatively, the list may present the devices according to a hierarchical scheme in which the user first chooses a device family made by that manufacturer, then chooses a particular device from the family of devices. Furthermore, the computer may allow the user to view specific information, such as speed and power consumption ratings, about one or more devices before making a decision.

In an alternative embodiment, the list includes not only device families and specific devices, but further includes device manufacturers. This would give a user even more design freedom by facilitating the process of migrating a design from one device manufacturer to another.

Returning again to block 54, if the user chooses to submit selection parameters to guide the computer in generating the list, the computer prompts the user for the selection parameters, as depicted in block 60. Selection parameters, and the method of using them, are discussed above and therefore will not be described in detail here. Using the parameters the computer generates a customized list presented to the user, as depicted in block 62. Customizing the list eliminates from the list devices that are not acceptable replacements of the first device. Once the user chooses a device from the list, the computer selects the device, as depicted in block 58.

Figure 5:
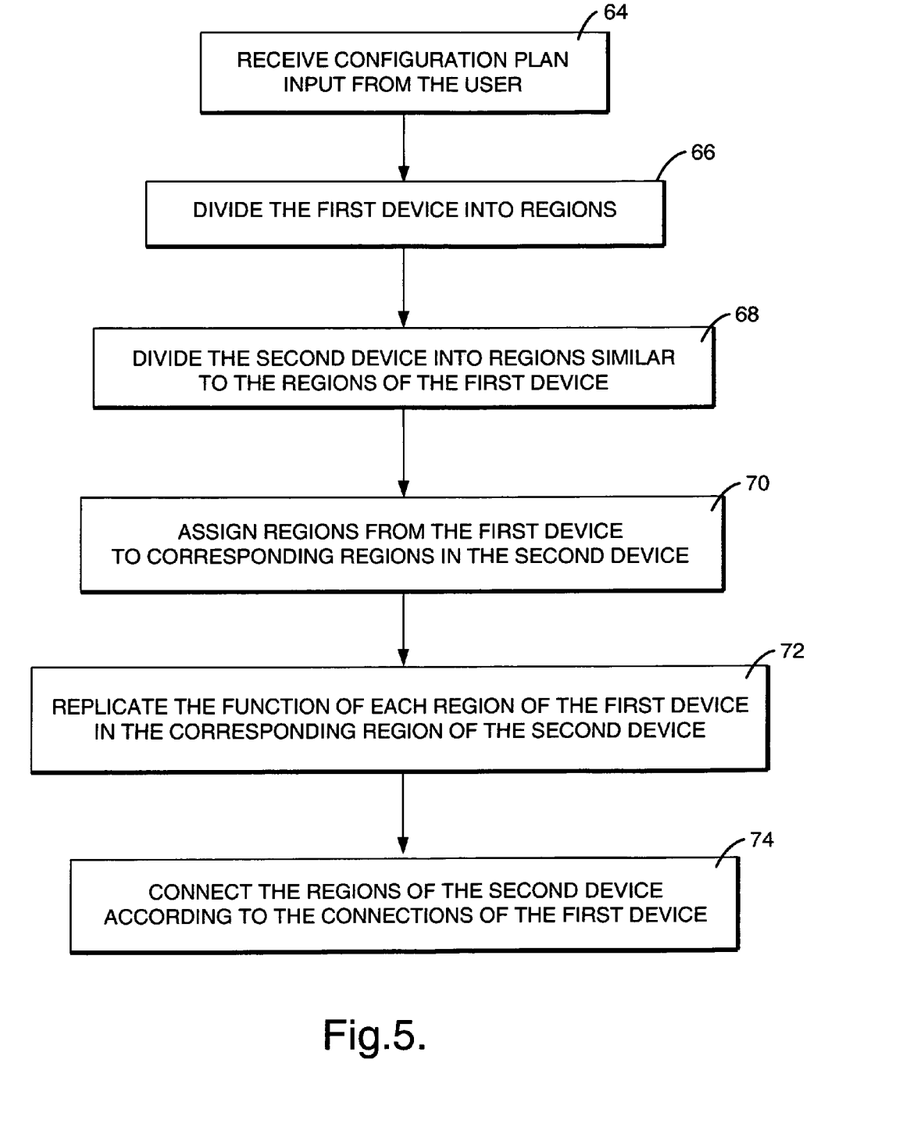
FIG. 5 is a flowchart of steps involved in a method of generating a configuration plan for the second device that implements a function of the first device.

Once the second device is selected, the computer begins the process of generating the configuration plan for the second device that implements one or more functions of the first device, as depicted in block 12 of FIG. 1. FIG. 5 illustrates a flowchart of steps involved in an exemplary method of generating the configuration plan. Broadly, the method involves receiving configuration plan input from the user, as depicted in block 64; dividing the first device into physical regions, as depicted in block 66; dividing the second device into similar physical regions, as depicted in block 68; assigning regions from the first device to corresponding regions of the second device, as depicted in block 70; replicating the function of each region in the first device in the corresponding region of the second device, as depicted in block 72; and connecting the regions of the second device, as depicted in block 74.

The step of receiving configuration plan input from the user broadly involves receiving information used by the host computer during one or more steps of the process of generating the configuration plan. The user input may direct the computer to use a particular method or combination of methods to divide the first and second devices into regions, for example, as explained below in greater detail. While the step of receiving configuration plan input from the user is listed first in the flowchart of steps of FIG. 5, it will be appreciated that this step may occur at any point in the process of generating the configuration plan, and may occur at numerous times during the process.

Dividing each of the devices into regions facilitates the replication process because the function of the first device is divided into portions corresponding to the regions, wherein the host computer replicates the function of the first device one portion at a time. While the size of the regions will vary from one device to another and from one manufacturer to another, the preferred size of a region for the second device must be sufficiently large to contain the logic from the corresponding region in the first device. One example of a region in the VIRTEX™ family of devices manufactured by XILINX™ is sixteen configurable logic blocks (CLBs), or four CLBs by four CLBs.

A variety of methods may be used to divide the first device into physical regions. A first method involves simply starting at a first corner of the first device, such as the upper-left corner, and creating a first region in that corner. A second region is created immediately to the right of the first region. Various regions are thus created linearly from the top left to the top right of the first device, creating a top row of regions. When the top row is complete, a second row is created in a similar manner immediately below the first row. This process is repeated until the first device has been completely divided into a grid of regions. This method works particularly well if the first device is composed primarily of arrays of CLBs, wherein the same pattern is substantially repeated across the device.

Another method may be preferred if the device includes one or more firm cores, such as a digital signal processing (DSP) core or a processor core. When such cores are included, it may be advantageous to center device replication around the core or cores to preserve, for instance, timing characteristics between the core and the configurable portion of the device. This may be accomplished by first replicating functionality of the core of the first device with the core of the second device, if necessary. Then regions are created that include design elements that most closely interact with the core, such as elements that communicate inputs to the core or receive outputs from the core.

Once the first generation of regions is completed, a second generation of regions is created. Regions of the second generation include elements that most closely interact with the elements of the first generation of regions, and typically are those that are physically proximate to the regions of the first generation. Successive generations of regions are thus created until all elements of the first device have been included in a region. This method is not only useful with devices that include firm cores, but may also be preferred if a device configuration includes one or more critical functions that the user desires to replicate first. In the latter case, the host computer allows the user to select the functions to replicate first by generating a graphical user interface that includes graphical representations of the various functions. The user could then select one or more of the functions to replicate first.

Yet another method of dividing the first device into regions involves beginning by creating a region at the center of the device. Subsequent regions are then created around the original region in a circular or spiral pattern, working toward the outer edges of the device. An advantage of this method is that all regions pertaining to a generation are equally distant from the center of the device, or the firsts region.

Yet another method of dividing the first device into regions involves beginning at input/output blocks located near the edge of the device by creating a first generation of regions that include design elements that most closely interact with the input/output blocks. Once the first generation of regions is complete a second region is created that includes design elements that most closely interact with the design elements of the first generation of regions. This process is repeated until all active elements of the first device are included in a region.

It will be appreciated that any of these methods may be used to divide the first device into regions, including any combination of these methods. The user may desire, for example, to center a first portion of the replication around a firm core and base a second portion of the replication on input/output blocks. The host computer preferably allows the user to choose which method to use by generating a list of possible methods and prompting the user to choose a method from the list. Alternatively, the computer may generate a graphical user interface that includes graphical representations of the various functions and allow the user to assign different methods to different functions or groups of functions. Furthermore, the computer may guide the user's decision by, for example, suggesting methods that are likely to produce more favorable results.

While the regions have been described as substantially uniform in nature across the device, the present invention is not so limited and contemplates physical regions of various sizes and shapes. Furthermore, nested regions may be desirable, for example, with a device that has a large amount of resources. Regions may be nested, for example, by first dividing the device into a plurality of top-level regions, and further dividing each top-level region into a plurality of lower-level regions. This approach may further simplify replication of complex designs.

In yet another embodiment one or more portions of a design in a first device may be mapped into a second device. Thus the whole design in the first device need not be mapped into the second device, but only a portion (or portions) of the design can be mapped into the second device.

When the first device has been divided into physical regions, the computer divides the second device into physical regions similar to the physical regions of the first device. The physical regions of the second device are similar to the physical regions of the first device in that they are substantially equivalent in size (that is, they include substantially the same number of design elements) and are located in substantially the same place on the respective devices.

When the second device is from the same family of devices as the first device, the regions of the second device may be substantially similar to the regions of the first device and thus may be quickly and easily generated. Where the second device is from a different family of devices or from a different manufacturer, the process of generating the regions of the second device may be protracted and involve altering the regions of the first device where, for example, the original regions of the first device could not be replicated in the second device.

When regions have been created in the second device that correspond to the regions of the first device, the computer replicates a function of each region of the first device in the corresponding region of the second device, as depicted in block 72. Furthermore, because the regions are relatively small, replicating a function from a region in the first device to a region in the second device will usually be relatively straightforward.

The function of the first region may include, for example, an adder, a shift register, and an arbitrary combinatorial logic design. Replicating the function would involve simply locating similar design elements in the corresponding region of the second device and connecting them to implement the functions. If a function of a region cannot be replicated in this manner, the computer may, for example, seek to borrow resources from another region that has unused design elements.

Once a function from each region of the first device has been replicated in a corresponding region of the second device, the regions of the second device are interconnected in the same manner as the regions of the first device, as depicted in block 74. Because the regions of the second device are situated similarly to the regions of the first device, most timing delays between regions will typically be preserved. It is possible, however, particularly where regions in the second device are only marginally similar to the regions of the first device, that timing issues will arise. In this event the computer generates a message with the information and presents the message to the user as part of the configuration report, as depicted in block 16 of FIG. 1 and discussed below in greater detail.

Figure 6:
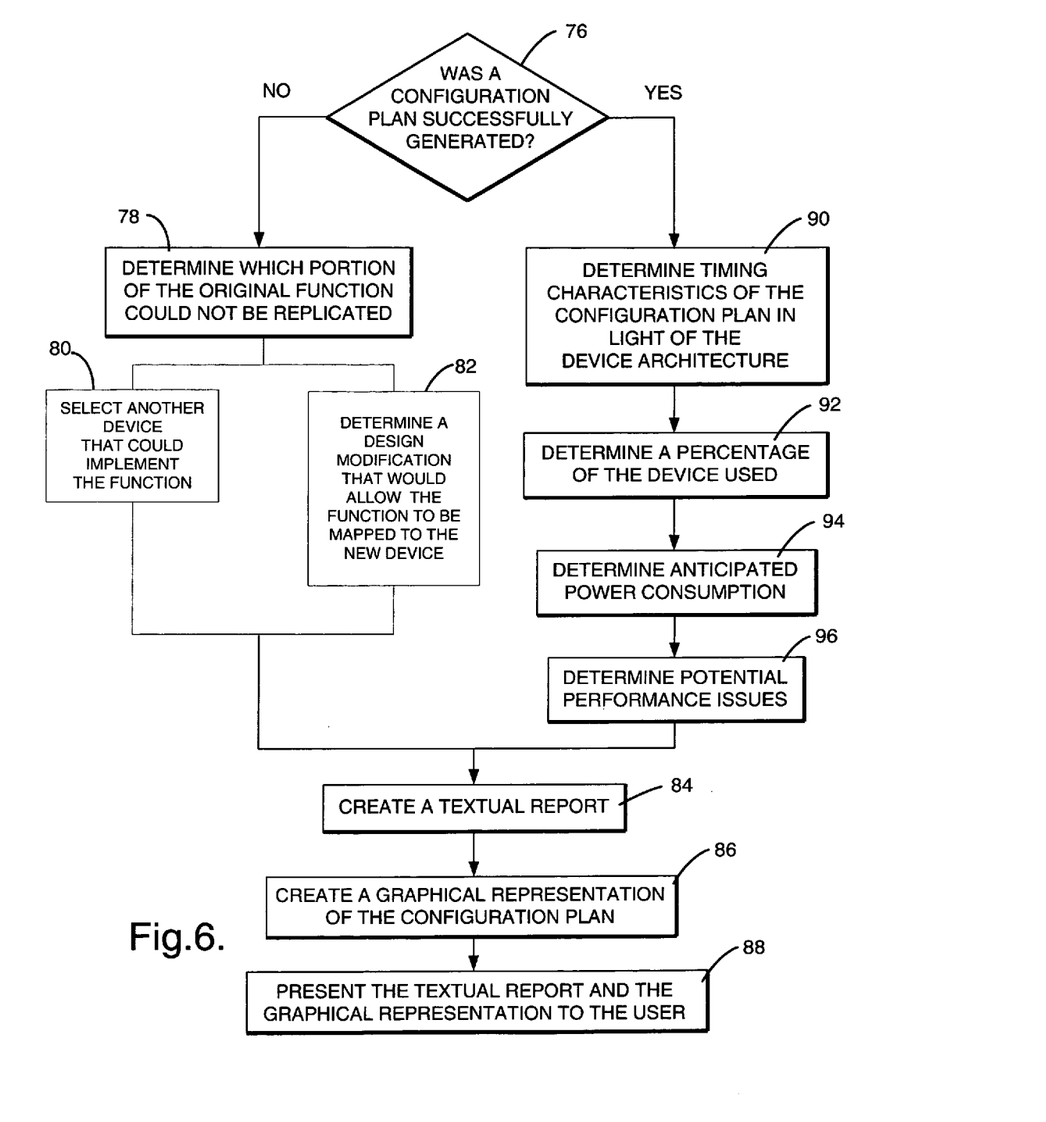
FIG. 6 is a flowchart of steps involved in a method of generating a device configuration report.

The configuration report generally includes information relating to whether or not the computer successfully generated a configuration plan and the general anticipated performance characteristics of the second device. FIG. 6 presents a flowchart of steps involved in an exemplary method of generating a configuration report.

The computer first determines whether a configuration plan was successfully generated, as indicated in block 76. A configuration plan may not have been successfully generated if, for example, one or more of the parameters could not be met. If the computer was not able to generate a configuration plan, the computer determines which portion of the original function could not be replicated in the configuration plan, as depicted in block 78. The computer then determines whether one or more other devices may be able to more easily accommodate the design, as depicted in block 80. The computer also concurrently determines whether a design modification may allow the function to be implemented in the second device, as depicted in block 82. The computer may determine, for example, which device selection parameters may be relaxed, and by how much, to enable the function to be implemented in the second device, as depicted in block 82.

The computer then generates a textual report with the above discussed information, and also generates a graphical representation of the (incomplete) configuration plan with indicators indicating problem areas, such as where a function could not be replicated. Finally, the computer presents the textual report and the graphical representation to the user.

Turning again to block 76, if the computer was able to generate a configuration plan, the computer first determines timing characteristics of the configuration plan in light of the architecture of the second device, as depicted in block 90. This may include, for example, the degree to which the original timing characteristics were varied in the new device and any potential problems associated with such variations. The computer also determines a percentage of the second device resources used, as depicted in block 92. The computer also determines an anticipated power consumption level associated with the configuration plan, as depicted in block 94. This may be a very broad estimate based on the percentage of resources used and operating frequency, for example.

The host computer also determines potential performance issues, as depicted in block 96. Performance issues include problems that may arise in relation to, for example, timing delays or power consumption. Timing constraints that are only narrowly met may present an issue because, for example, extreme changes in ambient temperature or other external factors may cause the device to exceed frequency thresholds and fail.

The computer then generates a textual report with the above discussed information, as depicted in block 84. The computer further generates a graphical representation of the configuration plan, as depicted in block 86. The graphical representation preferably includes indicators that designate potential problem areas, such as where timing constraints were only narrowly met. Finally, the computer presents the textual report and the graphical representation to the user, as depicted in block 88.

The computer allows the user to manipulate the configuration plan, as depicted in block 18 of FIG. 1. This is preferably accomplished by allowing the user to change connections between design elements via, for example, the graphical representation of the configuration plan.

If the user manipulates the configuration plan, the computer allows the user to verify the design changes by, for example, testing the manipulated design to ensure functionality is preserved. The computer may further analyze the manipulated design to generate a new configuration report with all of the information discussed above. Thus the user may manipulate the design, ascertain whether the changes corrected any problems, and manipulate the design again. This process may be repeated until the user works out any problems or otherwise creates the desired design.

When the computer and/or the user have created a configuration plan for the second device that the user deems acceptable, the computer generates a second bitstream for configuring the second programmable logic device according to the configuration plan, as depicted in block 20 of FIG. 1. The second bitstream is similar in form to the first bitstream, described above, in that it includes portions relating to model number of the second device as well as design elements and interconnects.

While the invention has been described as converting a first bitstream operable to configure a first single device to a second bitstream operable to configure a second single device, the invention is not so limited. The method may be employed, for example, to merge two designs by reading two bitstreams instead of one and generating a single configuration plan implanting functions from two devices corresponding to the bitstreams. Furthermore, the method may be used to implement a function in two or more devices.

If the second device, for example, does not include a firm core or other feature used in the first device, a user may need to generate a configuration plan implanting most of the original function in the second device and interfacing the second device with a third device that is used exclusively for implementing the core feature. The third device may be programmable, in which case a bitstream is generated for the third device. Alternatively, the third device may not be programmable, in which case no bitstream need be generated.

Other aspects and embodiments of the present invention will be apparent to those skilled in the art from consideration of the specification and practice of the invention disclosed herein. It is intended that the specification and disclosed embodiments be considered as examples only, with a true scope and spirit of the invention being indicated by the following claims.

Having thus described embodiments of the invention, what is claimed as new and desired to be protected by Letters Patent includes the following:

What is claimed is:

1. A computer-readable medium encoded with a computer program for directing a computer to perform a method of converting a first bitstream operable to configure a first programmable logic device to a second bitstream operable to configure a second programmable logic device, the method comprising the steps of:
   reading the first bitstream to determine a function of the first programmable logic device;
   dividing the first programmable logic device into physical regions according to a selected division technique, wherein each physical region comprises a plurality of design elements performing a portion of the function;
   generating a configuration plan for the second programmable logic device that divides the second programmable logic device into regions that substantially correspond to regions of the first programmable logic device, wherein the regions of the first programmable logic device and the corresponding regions of the second programmable logic device are located in substantially same locations on each respective programmable logic device, and wherein the configuration plan implements the function of the first programmable logic device within the second programmable logic device on a per region basis; and
   generating the second bitstream for configuring the second programmable logic device according to the configuration plan without compilation.

2. The computer-readable medium as set forth in claim 1, wherein the method further comprises the step of dividing the first bitstream into portions containing design element information, and design element interconnect information.

3. The computer-readable medium as set forth in claim 2, wherein the design element information relates to design elements selected from the group consisting of logic gates, look-up tables, flip-flops, latches, input/output blocks, clock management blocks, multiplexers, memory elements, shift registers, and firm cores.

4. The computer-readable medium as set forth in claim 1, wherein the method further comprises the step of dividing the first programmable logic device into physical regions by creating successive rows of regions on the device.

5. The computer-readable medium as set forth in claim 1, wherein the method further comprises the step of creating a first region near a center of the first programmable logic device and creating a first plurality of regions that encircle the first region.

6. The computer-readable medium as set forth in claim 1, wherein the method further comprises the step of creating a first plurality of regions on the first programmable logic device that includes design elements connected to input/output blocks.

7. The computer-readable medium as set forth in claim 1, wherein the method further comprises the step of replicating a function of a firm core of the first programmable logic device in a firm core of the second programmable logic device.

8. The computer-readable medium as set forth in claim 1, wherein the method further comprises the step of dividing the first programmable logic device into a plurality of top-level regions, and dividing each top-level region into a plurality of lower-level regions.

9. The computer-readable medium as set forth in claim 1, wherein the method further comprises the step of identifying design elements in each region of the second programmable logic device and matching each element to a substantially similar design element in a corresponding region of the first programmable logic device.

10. The computer-readable medium as set forth in claim 1, wherein the method further comprises the step of generating a configuration plan for a third programmable logic device that implements a portion of the function of the first programmable logic device.

* * * * *